(12) United States Patent
Potoček et al.

(10) Patent No.: US 9,620,330 B2
(45) Date of Patent: Apr. 11, 2017

(54) MATHEMATICAL IMAGE ASSEMBLY IN A SCANNING-TYPE MICROSCOPE

(71) Applicant: FEI Company, Hillsboro, OR (US)

(72) Inventors: Pavel Potoček, Eindhoven (NL); Cornelis Sander Kooijman, Veldhoven (NL); Hendrik Nicolaas Slingerland, Venlo (NL); Gerard Nicolaas Anne van Veen, Waalre (NL); Faysal Boughorbel, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 14/743,780

(22) Filed: Jun. 18, 2015

(65) Prior Publication Data

US 2015/0371815 A1 Dec. 24, 2015

(30) Foreign Application Priority Data

Jun. 18, 2014 (EP) ..................... 14172871

(51) Int. Cl.
*H01J 37/28* (2006.01)
*G02B 21/00* (2006.01)
*H01J 37/22* (2006.01)

(52) U.S. Cl.
CPC .......... *H01J 37/222* (2013.01); *G02B 21/008* (2013.01); *G02B 21/0048* (2013.01);
(Continued)

(58) Field of Classification Search
CPC ............. H01J 2237/226; H01J 2237/28; H01J 2237/2811; H01J 37/222; H01J 37/226;
(Continued)

(56) References Cited

U.S. PATENT DOCUMENTS 8,232,523 B2 * 7/2012 Boughorbel .......... H01J 37/222
250/306
8,581,189 B2 11/2013 Boughorbel et al.
(Continued)

FOREIGN PATENT DOCUMENTS

EP 2648208 10/2013
EP 2924708 9/2015
(Continued)

OTHER PUBLICATIONS http://www.vub.ac.be/META/toestellen_sem-edx.php, downloaded Feb. 17, 2016.*
(Continued)

*Primary Examiner* — Wyatt Stoffa
(74) *Attorney, Agent, or Firm* — Scheinberg & Associates, P.C.; Michael O. Scheinberg; John E. Hillert

(57) ABSTRACT

A method and apparatus for imaging a specimen using a scanning-type microscope, by irradiating a specimen with a beam of radiation using a scanning motion, and detecting a flux of radiation emanating from the specimen in response to the irradiation, in the first sampling session $\{S_1\}$ of a set $\{S_n\}$, gathering data from a first collection of sparsely distributed sampling points $\{P_1\}$ of set $\{P_n\}$. A mathematical registration correction is made to compensate for drift mismatches between different members of the set $\{P_n\}$, and an image of the specimen is assembled using the set $\{P_n\}$ as input to an integrative mathematical reconstruction procedure.

20 Claims, 3 Drawing Sheets

Figure 1:
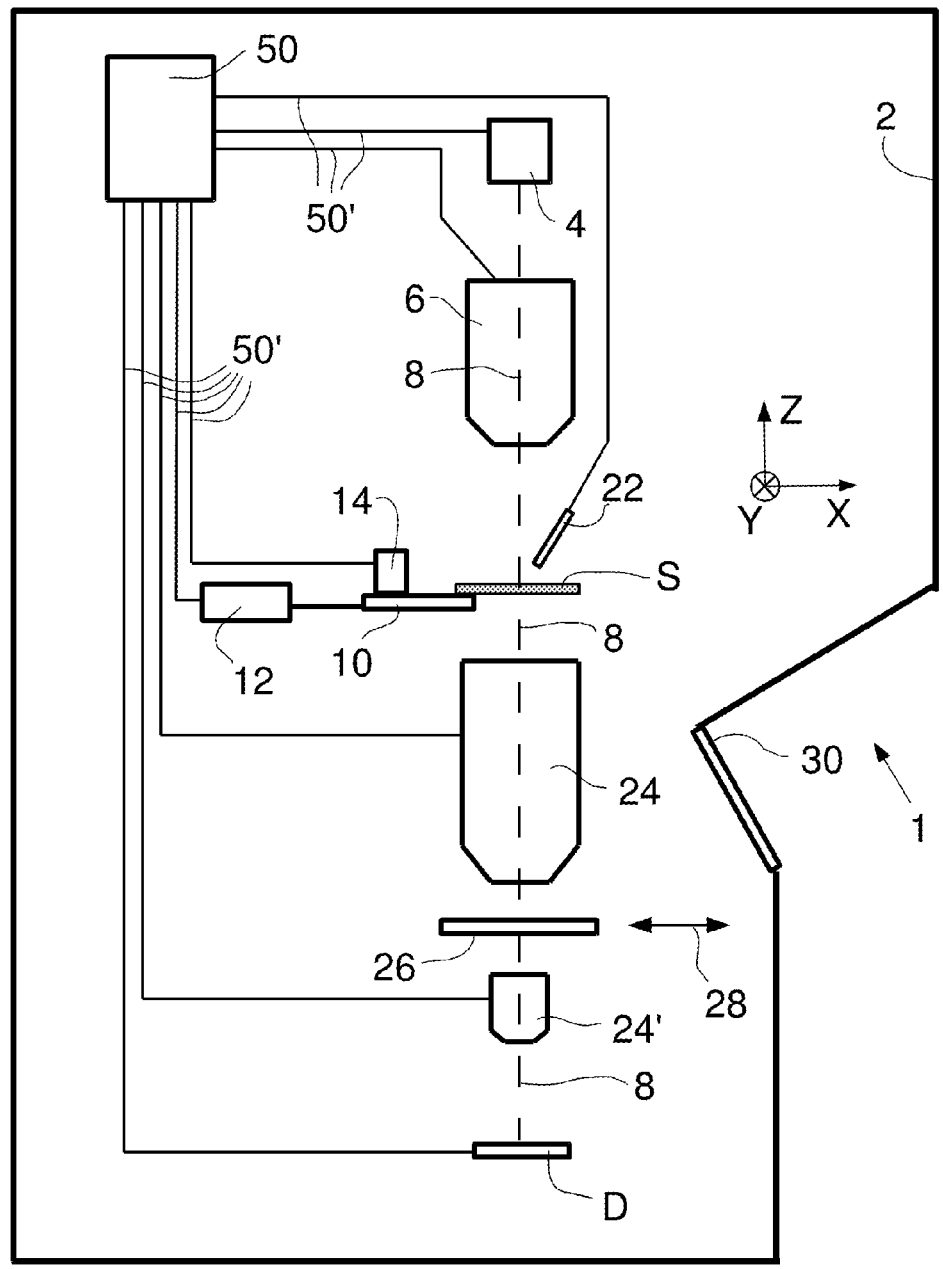

(52) U.S. Cl.
CPC ............ *H01J 37/226* (2013.01); *H01J 37/28* (2013.01); *G02B 21/0024* (2013.01); *H01J 2237/226* (2013.01); *H01J 2237/28* (2013.01); *H01J 2237/2811* (2013.01)

(58) Field of Classification Search
CPC .. H01J 37/28; H01J 2237/2809; H01J 37/265; G02B 21/0024; G02B 21/0048; G02B 21/008; G01N 23/225
See application file for complete search history.

(56) References Cited

U.S. PATENT DOCUMENTS

| | | | |
|---|---|---|---|
| 8,586,921 | B2 | 11/2013 | Boughorbel et al. |
| 8,588,509 | B1* | 11/2013 | Fua ...................... H01J 37/265 382/144 |
| 8,704,176 | B2 | 4/2014 | Boughorbel et al. |
| 8,907,280 | B1* | 12/2014 | Larson ................. G01N 23/225 250/307 |
| 8,933,401 | B1* | 1/2015 | Reed ....................... H01J 37/28 250/306 |
| 2012/0292503 | A1* | 11/2012 | Phifer, Jr. ............. H01J 37/222 250/307 |
| 2014/0226003 | A1* | 8/2014 | Phaneuf ................ H01J 37/222 348/80 |
| 2015/0069233 | A1* | 3/2015 | Anderson ............. H01J 37/222 250/307 |
| 2015/0109432 | A1* | 4/2015 | Dixon ................ G01N 21/6456 348/79 |
| 2016/0004060 | A1* | 1/2016 | Simpson ............ G02B 21/0084 348/80 |

FOREIGN PATENT DOCUMENTS

| | | |
|---|---|---|
| EP | 2924710 | 9/2015 |
| WO | 2012155267 | 11/2012 |

OTHER PUBLICATIONS

Anderson, Hyrum, et al., "Compressed Sensing for fast Electron Microscopy," TMS2014 Annual Meeting Supplemental Proceedings, Mar. 2014.*
Baraniuk, Richard, "Compressive Sensing," IEEE Signal Processing Magazine, Jul. 2007, pp. 118-121, vol. 118.
Boughorbel, Faysal, et al., "A new method for the registration of three-dimensional point-sets: The Gaussian Fields Framework," Image and Vision Computing, 2010, pp. 124-137, vol. 28.
Boughrobel, Faysal, et al., "Gaussian fields: a new criterion for 3D rigid registration," Pattern Recognition, 2004, pp. 1567-1571, vol. 3.
Calderbank, Robert, et al., "Construction of a Large Class of Deterministic Sensing Matrices That Satisfy a Statistical Isometry Property," IEEE Journal of Selected Topics in Signal Processing, 2010, pp. 358-374, vol. 4, No. 2.
Candes, Emammuel J., "Compressive sampling," International Congress of Mathematics, 2006, pp. 1433-1452, vol. 3, Madrid, Spain.
Devore, Ronald A., "Deterministic constructions of compressed sensing matrices," Journal of Complexity, 2007, pp. 918-925, vol. 23.
Elgammal, Ahmed, et al., "Efficient Kernal Density Estimation Using the Fast Gauss Transform with Applications to Color Modeling and Tracking," IEEE Transactions on Pattern Analysis and Machine Intelligence, 2003, V pp. 1499-1504, vol. 25, No. 11.
Escovitz, W. H., et al., "Scanning Transmission Ion Microscope with a Field Ion Source," Proc. Nat. Acad. Sci. USA, 1975, pp. 1826-1828, vol. 72, No. 5.
Greengard, Leslie, et al., "The Fast Gauss Transform," SIAM J. Scientific Computing, 1991, pp. 79-94, vol. 12, No. 1.
Murio, Diego A., "The Mollification Method and the Numerical Solution of Ill-Posed Problems," A Wiley-Interscience Publication, John Wiley & Sons, Inc., 1993, New York, New York.
Romberg, Justin, "Imaging via Compressive Sampling," IEEE Signal Processing Magazine, Mar. 2008, vol. 25, pp. 14-20.
Yang, Changjiang, et al., "Improved Fast Gauss Transform and Efficient Kernal Density Estimation," Proceedings of the Ninth IEEE International Conference on Computer Vision (ICCV 2003), pp. 464-471, Nice, France.
Unknown, "Confocal microscopy," //en.wikipedia.org/wiki/Confocal_microscopy, accessed Jun. 25, 2015, 9 pages.
Unknown, "Electron microscope," //en.wikipedia.org/wiki/Electron_microscope, accessed Jun. 25, 2015, 10 pages.
Unknown, "Quasi-Newton method," //en.wikipedia.org/wiki/Quasi-Newton_method, accessed Jun. 25, 2015, 4 pages.
Unknown, "Restricted isometry property," //en.wikipedia.org/wiki/Restricted_isometry_property, accessed Jun. 25, 2015, 2 pages.
Unknown, "Scanning electron microscope," //en.wikipedia.org/wiki/Scanning_electron_microscope , accessed Jun. 25, 2015, 17 pages.
Unknown, "Scanning Helium Ion Microscope," //en.wikipedia.org/wiki/Scanning_Helium_Ion_Microscope , accessed Jun. 25, 2015, 2 pages.
Unknown, "Scanning transmission electron microscopy," //en.wikipedia.org/wiki/Scanning_transmission_electron_microscopy, accessed Jun. 25, 2015, 4 pages.
Unknown, "Transformation matrix," //en.wikipedia.org/wiki/Transformation_matrix, accessed Jun. 25, 2015, 7 pages.
Unknown, "Transmission electron microscopy," //en.wikipedia.org/wiki/Scanning_electron_microscope, accessed Jun. 25, 2015, 21 pages.
Unknown, "Iterative Closest Point," //en.wikipedia.org/wiki/Iterative_closest_point, accessed Aug. 3, 2015, 2 pages.
Hyrum S. Anderson et al., "Compressed Sensing for Fast Electron Microscopy", TMS2014 Annual Meeting Supplemental Proceedings, Jan. 1, 2014, 9 pages.
Hyrum S. Anderson et al., "Sparse Imaging for Fast Electron Microscopy", Proceedings of SPIE, vol. 8657, Feb. 14, 2013, 12 pages.
Benjamin Berkels et al., "Optimized Imaging Using Non-Rigid Registration", Ultramicroscopy, vol. 138, Mar. 1, 2014, 11 pages.
P. Ye et al., "Compressive Confocal Microscopy", IEEE International Conference on Acoustics, Speech and Signal Processing, ICASSP 2009, Apr. 19, 2009, 4 pages.
Marco F. Duarte et al., "Single-Pixel Imaging via Compressive Sampling", IEEE Signal Processing Magazine, vol. 25, No. 2, Mar. 1, 2008, 9 pages.

* cited by examiner $S_1, P_1$ $S_2, P_2$

MATHEMATICAL IMAGE ASSEMBLY IN A SCANNING-TYPE MICROSCOPE

The invention relates to a method of accumulating an image of a specimen using a scanning-type microscope, comprising the following steps:
- Providing a beam of radiation that is directed from a source through an illuminator so as to irradiate the specimen;
- Providing a detector for detecting a flux of radiation emanating from the specimen in response to said irradiation;
- Causing said beam to undergo scanning motion relative to a surface of the specimen, and recording an output of the detector as a function of scan position.

The invention also relates to a scanning-type microscope in which such a method can be performed. Such a microscope may use charged particles to irradiate the specimen (as in the case of a Scanning Electron Microscope, Scanning Transmission Electron Microscope, Scanning Ion Microscope and Scanning Transmission Ion Microscope, for example), or it may use photons for this purpose (as in a confocal microscope, for example).

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:
- In a SEM, irradiation of a specimen by a scanning electron beam precipitates emanation of "auxiliary" radiation from the specimen, in the form of secondary electrons, backscattered electrons, X-rays and photoluminescence (infrared, visible and/or ultraviolet photons), for example; one or more components of this flux of emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the flux of transmitted electrons emanating from the specimen can then be used to create an image. When such a TEM is operated in scanning mode (thus becoming a STEM), the image in question will be accumulated during a scanning motion of the irradiating electron beam.

More information on some of the topics elucidated here can, for example, be gleaned from the following Wikipedia links:
- en.wikipedia.org/wiki/Electron_microscope
- en.wikipedia.org/wiki/Scanning_electron_microscope
- en.wikipedia.org/wiki/Transmission_electron_microscopy
- en.wikipedia.org/wiki/Scanning_transmission_electron_microscopy As an alternative to the use of electrons as irradiating beam, charged-particle microscopy can also be performed using other species of charged particle. In this respect, the phrase "charged particle" should be broadly interpreted as encompassing electrons, positive ions (e.g. Ga or He ions), negative ions, protons and positrons, for instance. As regards ion-based microscopy, some further information can, for example, be gleaned from sources such as the following:
- en.wikipedia.org/wiki/Scanning_transmission_electron_m icroscopy
- W. H. Escovitz, T. R. Fox and R. Levi-Setti, *Scanning Transmission Ion Microscope with a Field Ion Source*, Proc. Nat. Acad. Sci. USA 72(5), pp 1826-1828 (1975).

It should be noted that, in addition to imaging, a charged-particle microscope (CPM) may also have other functionalities, such as performing spectroscopy, examining diffractograms, performing (localized) surface modification (e.g. milling, etching, deposition), etc.

Apart from using charged particles as irradiating beam, it is also possible to perform scanning microscopy using a photon beam. An example of such a technique is so-called confocal microscopy, in which scanning irradiation by a point source of photons stimulates localized emanation of fluorescence radiation from the specimen. A detector can be used to collect (part of) this flux of fluorescence radiation and accumulate an image on the basis thereof. More information on this topic can, for example, be gleaned from the following Wikipedia link:
- en.wikipedia.org/wiki/Confocal_microscopy In all cases, a scanning-type microscope will comprise at least the following components:
- A radiation source, such as a Schottky source or ion gun in the case of a CPM, or a laser or lamp in the case of an optical microscope.
- An illuminator, which serves to manipulate a "raw" radiation beam from the source and perform upon it certain operations such as focusing, aberration mitigation, cropping (with an aperture), filtering, etc. It will generally comprise one or more (charged-particle) lenses, and may comprise other types of (particle-) optical component also. If desired, the illuminator can be provided with a deflector system that can be invoked to cause its output beam to perform a scanning motion across the specimen being investigated.
- A specimen holder, on which a specimen under investigation can be held and positioned (e.g. tilted, rotated). If desired, this holder can be moved so as to effect the desired scanning motion of the beam w.r.t. the specimen. In general, such a specimen holder will be connected to a positioning system such as a mechanical stage.
- A detector, which may be unitary or compound/distributed in nature, and which can take many different forms, depending on the radiation being detected. Examples include photomultipliers (including solid-state photomultipliers, SSPMs), photodiodes, CMOS detectors, CCD detectors, photovoltaic cells, etc., which may, for example, be used in conjunction with a scintillator film, for instance.

Although various forms of scanning microscopy have been known for decades, they have a common shortcoming that is starting to manifest itself as a bottleneck in many areas of science and technology. This shortcoming has to do with the fact that scanning-based imaging tends to be a relatively slow and tedious process, which has therefore traditionally been limited to investigating very small (portions of) specimens, e.g. on a typical scale of tens of nanometers in CPMs and tens of microns in confocal microscopy.

Yet, in many areas of human endeavor, there is an increasing need to maintain the resolution offered by these techniques, but to expand their imaging areas by orders of magnitude. For example:

- In cellular biology, there is a desire to expand cellular-level imaging to the tissue level, e.g. so as to more clearly investigate the interaction between (different types of) cells, particularly in brain tissue, muscle tissue, neoplasms (cancer tissue), etc.
- In mineralogy/petrology, there is a need to expand analyses at molecular level to the level of grains and grain boundaries, e.g. so as to more clearly investigate gas trapping behavior in stone matrix material in fracking studies, precious metal encapsulation in quartz formations, unwanted inclusions in synthetic gems and other crystals, etc.
- In the semiconductor industry, there is a desire to expand investigations at the level of individual junctions to a broader qualification of entire devices and arrays of devices, e.g. as when performing quality control vis-à-vis critical dimension, overlay, contamination, etc.

However, extending current scanning microscopy techniques to such large imaging scales would entail such hugely augmented image accumulation times as to basically render such extension untenable. Therefore, despite great desire and need, current techniques are so impractical as to exclude themselves from realistic applicability in this regard.

Another problem with present-day scanning microscopy techniques can manifest itself when imaging radiation-sensitive specimens, such as (living) biological specimens, cryogenic specimens, etc. The very act of irradiating such specimens with an energetic beam (particularly a charged-particle beam) tends to cause damage (such as molecular re-arrangement/mutation, thawing, desiccation, etc.) at/near an impingement footprint of the irradiating beam. In order to mitigate this effect, one might consider reducing the intensity and/or increasing the scan speed of the irradiating beam, but such measures generally lead to an undesirable decrease in signal-to-noise ratio (SNR).

It is an object of the invention to address these issues. In particular, it is an object of the invention to provide a scanning microscopy method that is capable of imaging relatively large specimen areas without incurring an untenable throughput penalty. Moreover, it is an object of the invention that such a method should allow radiation-sensitive specimens to be imaged with an acceptable SNR and yet with reduced risk of radiation damage.

These and other objects are achieved in a method as set forth in the opening paragraph above, which method is characterized in that it additionally comprises the following steps:

- In a first sampling session $S_1$, gathering detector data from a first collection $P_1$ of sampling points distributed sparsely across the specimen;
- Repeating this procedure so as to accumulate a set $\{P_n\}$ of such collections, gathered during an associated set $\{S_n\}$ of sampling sessions, each set with a cardinality $N>1$;
- Assembling an image of the specimen by using the set $\{P_n\}$ as input to an integrative mathematical reconstruction procedure, wherein, as part of said assembly process, a mathematical registration correction is made to compensate for drift mismatches between different members of the set $\{P_n\}$.

The essence of the current invention can be set forth as follows, whereby reference is made to the concept of a "scan grid", which is an imaginary mathematical grid superimposed upon the specimen and containing an array of juxtaposed sampling cells. In conventional scanning microscopy, this entire scan grid is "filled" because, in tracing out a scan path on the specimen, the scanning beam "observes" every cell in the grid. However, in the current invention, each sampling session $S_n$ observes only a relatively sparse collection $P_n$ of cells in the grid, and the cumulative/resultant set $\{P_n\}$ of such sparse collections—resulting from a whole set $\{S_n\}$ of repeated sampling sessions—also represents only a partial "sprinkling" of cells in the grid. Consequently:

- Because the scan grid is not filled, the invention achieves a reduced (cumulative) scan time for the specimen.
- Because the scan grid is not filled, the invention achieves a reduced (cumulative) radiation dose for the specimen.
- In order to be able to assemble a "full" image from a partially-filled scan grid, the invention needs to use clever computational techniques, which will be elucidated in more detail hereunder.

The invention achieves further substantial advantages by accumulating an image using a "multiple-pass" approach, whereby data for a final image are gathered in a series of sampling sessions rather than in a single session. This technique was advanced by the inventors to make allowances for the fact that a microscope specimen is basically in a perpetual state of (unwanted) motion, e.g. due to holder/stage vibration, Brownian motion, biological locomotion, etc. In order to understand this aspect of the invention, a degree of analogy can be made to sports photography, for example, where a moving object (e.g. a running athlete) needs to be captured in a photograph. If a single, long exposure is used, the resultant image will be blurred, because the moving subject changes position during the exposure. On the other hand, if a series of short exposures is made, the result will be a "train" of time-successive sharp images. However, whereas a sports photographer will generally have the luxury of having sufficient illumination at his disposal, the microscope user (particularly in the case of a CPM) will generally be (severely) constrained by (cumulative) dose considerations: too much dose can ruin a specimen, and too little dose will result in poor SNR. Therefore, unlike the sports photographer, the microscope user will generally need to add up the individual sub-images resulting from the various sampling sessions, in order to secure a desired cumulative exposure. However, in so doing, he will have to make allowances for "inter-frame" specimen motion between capture of successive sub-images. The current invention achieves this by making the aforementioned mathematical registration correction, which is a non-trivial aspect of the inventive image assembly process, and which will be elucidated in more detail hereunder.

It should be noted that a further advantage of performing a multi-pass exposure in this manner is that, in dividing a given (cumulative) dose into a number of (component) sub-doses, the specimen has time to "recover" after each sub-dose and before receiving a subsequent sub-dose. This can help to mitigate radiative damage to the specimen, such as burning, melting, thawing, shocking (of crystalline structures), etc., and can also help to mitigate "collateral damage" in the form of unwanted thermal creep/migration through the sample (into regions adjacent to a region being irradiated).

As regards the mathematics of the current invention, these can be regarded as being sub-divided into two main steps/aspects, namely registration correction and reconstruction. However, the present invention does not place rigid restrictions on the order in which these steps are performed, and it even allows convoluted (interwoven) performance of these steps if desired. More specifically:

(I) In a particular embodiment of the invention:
  Each member $P_n$ of the set $\{P_n\}$ is used to mathematically reconstruct a corresponding sub-image $I_n$;
  Said mathematical registration correction is used to align the members of the sub-image set $\{I_n\}$;
  A combined image is mathematically composed from said aligned sub-image set.

Such an embodiment can be labelled as "registration correction (alignment) following reconstruction", and will hereafter be referred to as a "Type I approach" to image assembly.

(II) In an alternative embodiment to such a Type I approach:
  Prior to reconstruction, said mathematical registration correction is used to align the members of the collection set $\{P_n\}$;
  A composite image is mathematically reconstructed from said aligned collection set.

Such an embodiment can be labelled as "reconstruction following registration correction (alignment)", and will hereafter be referred to as a "Type II approach" to image assembly.

These two different approaches tend to have their own particular advantages. For example:
  In a Type I approach, the process of registration tends to be somewhat easier, since it is carried out on processed sub-images rather than on un-processed data collections $P_n$. Such sub-images will tend to be relatively "pixel-rich", making it easier to mutually compare them for registration purposes (see Embodiment 3 below).
  In a Type II approach, reconstruction is conducted on a fuller data set (the aligned members of collection set $\{P_n\}$) than in the case of a Type I approach (individual sub-images $I_n$). Consequently, a Type II approach tends to be more accurate when attempting to reconstruct an image comprising relatively high spatial frequencies (e.g. associated with non-repetitive features, discontinuities, relatively intense variations in contrast, etc.).

The skilled artisan will grasp these points, and will be able to choose an approach best suited to the particulars of a given imaging situation.

In a particular embodiment of the current invention, different members of the set $\{P_n\}$ represent different associated sparse collections/distributions of sampling points across the specimen. In other words, with reference to the concept of a scan grid introduced above, the observed/sampled grid cells for a given member $P_i$, of $\{P_n\}$ will generally be different to those for a different member $P_j$, of $\{P_n\}$, although some limited degree of overlap/commonality (redundancy) may nevertheless be present. Such an embodiment has inter alia the advantage that, when the various members of $\{P_n\}$ are integratively "combined" during reconstruction, the resulting cumulative distribution of sampling points will represent a larger area of the specimen than the distribution of sampling points in individual members of $\{P_n\}$. Such increased "coverage" of the sample facilitates reconstruction. That having been said, it is possible to conceive situations in which different members of $\{P_n\}$ do not necessarily have to represent different associated sparse distributions of sampling points. For example, if a specimen is in a state of substantial temporal flux (e.g. because it is undergoing significant motion and/or evolution) then, even if members of the set $\{P_n\}$ represent the same sparse distributions of sampling points relative to a fixed spatial reference frame, the various sampling sessions involved will still capture different "snapshots" of the specimen in a temporal sense, and thereby provide satisfactory input to the subsequent reconstruction procedure.

As a general comment, but also with some particular reference to the previous paragraph, it should be noted that the sets $\{P_n\}$ may be acquired sequentially or concurrently, and that they may be acquired using one or more scanning beams, according to desire. The use of several beams simultaneously is a throughput-efficient way of visiting different sampling points, whereby:
  If the beams in question are similar in nature, several sampling points in a given collection $P_i$, can be simultaneously "illuminated";
  If the beams in question are mutually different in some way (e.g. are modulated differently, or comprise different species of particle, for instance), then at least two different collections $P_i$, $P_j$ can be simultaneously assembled, because sampling points illuminated by the beam(s) assigned to assemble collection $P_i$, can be distinguished from the beam(s) assigned to assemble collection $P_j$, even though the beams are scanning concurrently.

More information on the use of multiple beams can, for example, be gleaned from co-pending European Patent Applications EP 14161505 and EP 14161519.

Another embodiment of the present invention is characterized in that at least one member $P_n$ of the set $\{P_n\}$ comprises a sparse distribution of sampling points that is not (entirely) arranged on a regular grid. This is because, in general, the mathematical reconstruction procedure employed by the invention can assume its most generic form when the various sparse distributions associated with $\{P_n\}$ are non-regular (e.g. random, or quasi-random), since, in such instances, use can be made of the so-called Restricted Isometry Property (RIP) of employed reconstruction matrices. However, that is not to say that (quasi-)regular distributions are completely forbidden by the current invention: in such cases, mathematical reconstruction may still be possible provided certain boundary conditions are satisfied. In this regard, more information, can, for example, be gleaned from the following mathematical references:
  Ronald A. DeVore, *Deterministic Constructions of Compressed Sensing Matrices*, Journal of Complexity 23, pp. 918-925 (2007):
  dsp.rice.edu/sites/dsp.rice.edu/files/cs/Henryk.pdf
  R. Calderbank, S. Howard & S. Jafarpour, *Construction of a large class of deterministic sensing matrices that satisfy a statistical isometry property*, IEEE Journal on Selected Topics in Signal Processing 4(2) pp. 358-374 (2010).

For completeness, reference is also made to the following Wikipedia reference on RIP:
  en.wikipedia.org/wiki/Restricted_isometry_property When reference is made to drift mismatches between different members of the set $\{P_n\}$ in the context of the current invention, one can make a distinction between lower-order and higher-order examples of such mismatches, whereby:
  Examples of lower-order mismatches include displacement, rotation, and combinations hereof;
  Examples of higher-order mismatches include skew, shear, scaling (magnification mismatch), and combinations hereof.

Depending on the particulars of a given situation—e.g. the physical processes causing the mismatches in question (such as thermal expansion/contraction, hysteresis, etc.), the desired level of imaging/reconstruction accuracy, available time/processing power, etc.—one may decide to correct for all such mismatches, or just for some of them (e.g. just the lower-order ones). Such selectivity can be relatively easily incorporated into the mathematics of the invention by appropriate choice of the transformation T used to describe the drift mismatches (see Embodiment 3, for example). For instance, if such a transformation is represented by a matrix operator, then different types of drift can be represented by different (diagonal/non-diagonal/symmetric/non-symmetric) entries in the matrix in question: for example, scaling by a diagonal matrix, rotation by an orthogonal matrix, shear by an affine matrix, etc. See, in this regard, the following Wikipedia reference on transformation matrices:

en.wikipedia.org/wiki/Transformation_matrix

The skilled artisan will grasp these points, and will be able to choose the degree and type of mismatch correction that he wishes to perform when executing the current invention.

With reference to the discussion above, it is conceivable that, in certain situations, the magnitudes of any drift-related mismatches concerned are so small that the above-mentioned registration correction is deemed to be unnecessary. In other words, if the effect of the abovementioned transformation T judged to be minimal, and non- performance of the transformation T judged to produce an acceptable error in the image reconstruction result, then one may decide to skip the aforementioned registration correction step. Such a scenario falls within the scope of the current invention, because it still involves an assessment/evaluation of the transformation T, and effectively assigns a unity value to T.

In the present invention, each member $P_n$ of the set $\{P_n\}$ represents a given sparse distribution (pattern) of sampling points. Bearing in mind the discussion above, one can ask oneself how one is to choose the particular details of the distribution associated with a given sampling session $S_n$, i.e. how one is to choose the particular sampling point pattern associated with a given collection $P_n$. In this context, one can, for example, make a distinction between the following scenarios:

(a) A "blind" or "independent" selection. In this case, the positions of sampling points in the various collections $P_n$ are pre-decided without input or influence from the (intermediate results of the) imaging procedure in which they are deployed. For example, the distribution of data points associated with each collection $P_n$ may be determined by a random pattern generator, or by reference to a log of pre-stored patterns.

(b) A "steered" or "dependent" selection. In this case, the positions of sampling points in at least one given collection $P_n$ are (at least partially) elected on the basis of an analysis of (at least some) previously obtained scan information. Such election will typically involve some degree of on-the-fly, feedback tuning. For example, in deciding the distribution/pattern of sampling points associated with collection $P_m$ in sampling session $S_m$, one may make use of an analysis of sampling results obtained in at least one previous sampling session $S_i$—e.g. so as to concentrate more sampling points in observed "data-rich" locations and fewer sampling points in observed "data-poor" locations, thus improving/optimizing the "usefulness" of follow-up sampling sessions based on a learning curve that draws upon preceding sampling sessions. Such analysis of preceding/preluding scan results can, for example, be (automatically) performed using (a form of) image recognition software and/or (a form of) data binning to identify (the coordinates of) data-rich locations, allowing a greater sampling "weight" to be allocated to such locations in a next sampling session.

In a particular embodiment of scenario (b) as set forth in the previous paragraph, the following applies In a given sampling session $S_n$, sampling points in the associated collection $P_n$ are visited sequentially while scanning out a line-by-line pattern on the specimen;

Along a given line $L_j$ in said line-by-line pattern, the positions of sampling points are elected using detection results obtained in scanning a previous line $L_i$ in said line-by-line pattern.

Conventionally, sub-dividing a scanning action into one-dimensional segments (lines) is a convenient way of allowing a scan parameter to be adjusted on the fly, e.g. as in the case of the line scan used to produce a two-dimensional picture on a Cathode Ray Tube, or to scan a document page incrementally. In the context of the current invention, it forms the basis of the following strategy:

In a given scan field, assume the presence of a feature F with a characteristic width W.

Sub-divide the scan field into lines with a mutual spacing less than W.

If (some part of) feature F is encountered at a longitudinal coordinate $L_F$ during a line scan $S_n$, then one can expect a vicinal part of F to be encountered at and/or proximal to longitudinal coordinate $L_F$ during the next line scan $S_{n+1}$. Consequently, in choosing sampling points for collection $P_{n+1}$ associated with line scan (sampling session) $S_{n+1}$, one can elect to have a deliberately elevated occurrence/concentration of such points in the vicinity of position $L_F$.

In this way, sampling choices for scan $S_{n+1}$ are fined-tuned on the basis of observed data during scan $S_n$.

Although the discussion above may have cited two-dimensional and one-dimensional sampling/scanning strategies in setting forth the invention, such discussion should not be regarded as limiting the invention's scope. In this context, a particular embodiment of the present invention is characterized in that, in at least one sampling session $S_n$, at least some of the sampling points in the associated collection $P_n$ are located below said surface of the specimen (sub-surface scanning). For example, a physical slicing procedure (using a microtome, or ion milling beam, for instance) could be (iteratively) employed to remove a thin layer of material from an initial surface ($L_i$) so as to expose an underlying next surface ($L_{i+1}$), with one or more sampling sessions being performed on each of these surfaces (and, if desired, on similarly exposed subsequent surfaces $L_{i+2}$, $L_{i+3}$, etc.). In such an approach, the image assembled by the invention is (quasi-)volumetric (three-dimensional). This aspect of the invention may be regarded as an extension of the inventive "sparse scanning" concept—with associated "inter-frame" drift correction—to multi-dimensional computational microscopy techniques, e.g. such as those disclosed in the following patent documents (all in the name of the current assignee, and with at least some inventors in common with the current invention):

U.S. Pat. No. 8,232,523/EP 2 383 768 B1;
U.S. Pat. No. 8,581,189/EP 2 557 586 B1;
U.S. Pat. No. 8,586,921/EP 2 557 587 A2;
U.S. Pat, No. 8,704,176/EP 2 648 208 A2;

The invention will now be elucidated in more detail on the basis of exemplary embodiments and the accompanying schematic drawings, in which:

FIG. 1 renders a longitudinal cross-sectional elevation of a scanning-type microscope in which an embodiment of the current invention can be carried out.

Figure 2A:
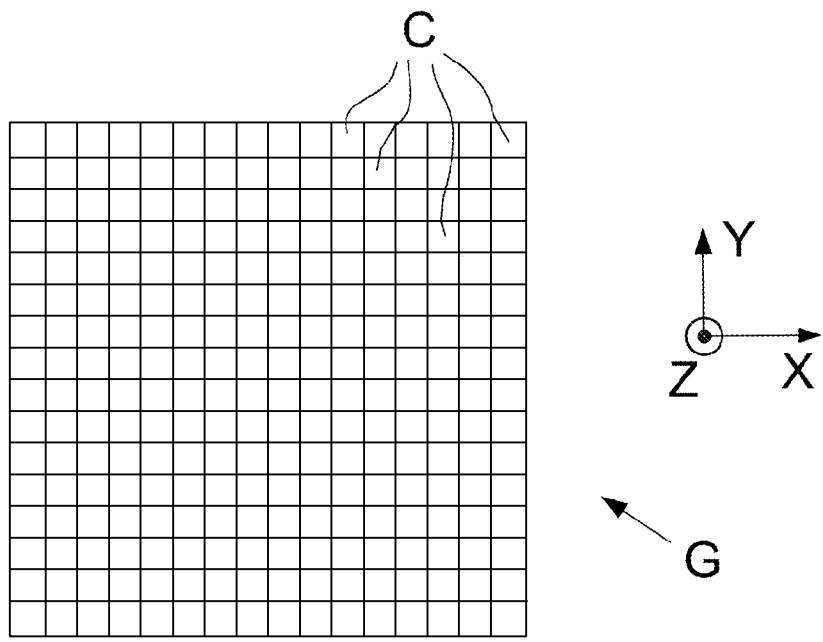
Figure 2B:
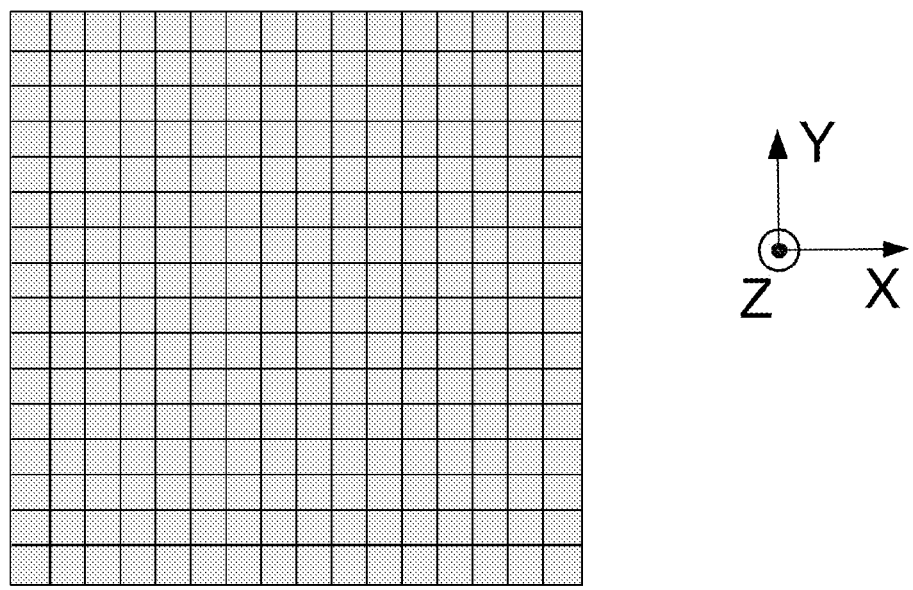

FIGS. 2A and 2B schematically depict certain aspects of a conventional method of image accumulation in a scanning-type microscope.

Figure 3A:
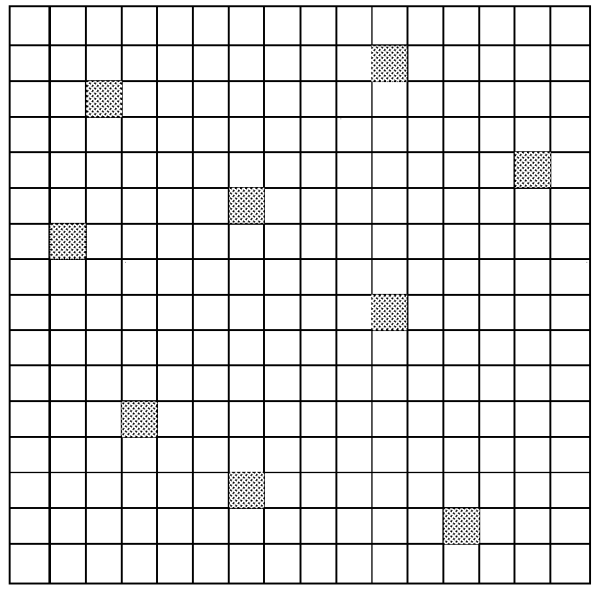
Figure 3A:
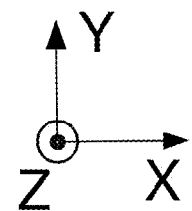
Figure 3B:
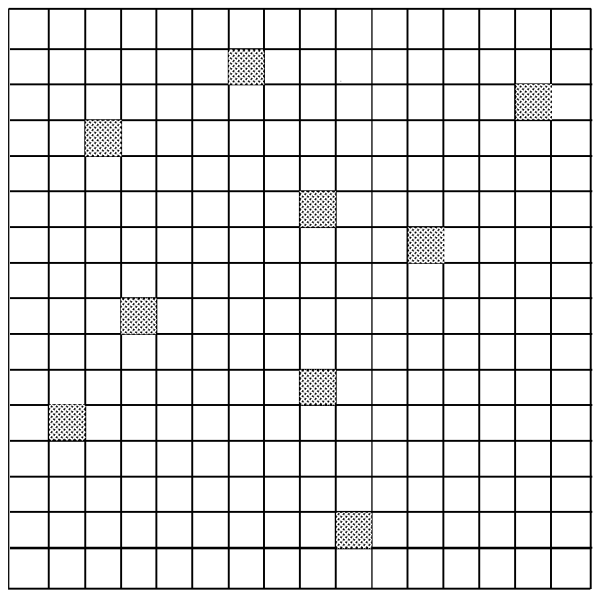
Figure 3B:
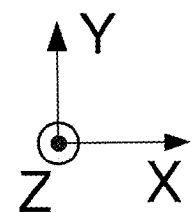

FIGS. 3A and 3B schematically depict certain aspects of an embodiment of a method of image accumulation in a scanning-type microscope according to the current invention.

In the Figures, where pertinent, corresponding parts are indicated using corresponding reference symbols. It should be noted that, in general, the Figures are not to scale.

Embodiment 1

FIG. 1 is a highly schematic depiction of an embodiment of a scanning-type microscope 1 that lends itself to use in conjunction with the current invention; the depicted microscope is a STEM (i.e. a TEM, with scanning functionality) but, in the context of the current invention, it could just as validly be a SEM, confocal microscope, scanning ion microscope, etc. In the Figure, within a vacuum enclosure 2, an electron source 4 (such as a Schottky gun, for example) produces a beam of electrons that traverse an electron-optical illuminator 6, serving to direct/focus them onto a chosen region of a (substantially planar) specimen S. This illuminator 6 has an electron-optical axis 8, and will generally comprise a variety of electrostatic/magnetic lenses, (scan) deflectors, correctors (such as stigmators), etc.; typically, it can also comprise a condenser system.

The specimen S is held on a specimen holder 10 than can be positioned in multiple degrees of freedom by a positioning device (stage) 12; for example, the specimen holder 10 may comprise a finger that can be moved (inter alia) in the XY plane (see the depicted Cartesian coordinate system). Such movement allows different regions of the specimen S to be irradiated/imaged/inspected by the electron beam traveling along axis 8 (in the –Z direction) (and/or allows scanning motion to be performed, as an alternative to beam scanning). An optional cooling device 14 is in intimate thermal contact with the specimen holder 10, and is capable of maintaining the latter at cryogenic temperatures, e.g. using a circulating cryogenic coolant to achieve and maintain a desired low temperature.

The focused electron beam traveling along axis 8 will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of detector 22, which might be a combined scintillator/photomultiplier or EDX (Energy-Dispersive X-Ray Spectroscopy) detector, for instance; in such a case, an image could be constructed using basically the same principle as in a SEM. However, alternatively or supplementally, one can study electrons that traverse (pass through) the specimen S, emerge from it and continue to propagate (substantially, though generally with some deflection/scattering) along axis 8. Such transmitted electrons enter an imaging system (combined objective/projection lens) 24, which will generally comprise a variety of electrostatic/magnetic lenses, deflectors, correctors (such as stigmators), etc. In normal (non-scanning) TEM mode, this imaging system 24 can focus the transmitted electrons onto a fluorescent screen 26, which, if desired, can be retracted/withdrawn (as schematically indicated by arrows 28) so as to get it out of the way of axis 8. An image of (part of) the specimen S will be formed by imaging system 24 on screen 26, and this may be viewed through viewing port 30 located in a suitable portion of the wall 2. The retraction mechanism for screen 26 may, for example, be mechanical and/or electrical in nature, and is not depicted here.

As an alternative to viewing an image on screen 26, one can instead make use of electron detector D, particularly in STEM mode. To this end, adjuster lens 24' can be enacted so as to shift the focus of the electrons emerging from imaging system 24 and re-direct/focus them onto detector D (rather than the plane of retracted screen 26: see above). At detector D, the electrons can form an image (or diffractogram) that can be processed by controller 50 and displayed on a display device (not depicted), such as a flat panel display, for example. In STEM mode, an output from detector D can be recorded as a function of (X,Y) scanning beam position on the specimen S, and an image can be constructed that is a "map" of detector output as a function of X,Y. The skilled artisan will be very familiar with these various possibilities, which require no further elucidation here.

Note that the controller (computer processor) 50 is connected to various illustrated components via control lines (buses) 50'. This controller 50 can provide a variety of functions, such as synchronizing actions, providing setpoints, processing signals, performing calculations, and displaying messages/information on a display device (not depicted). Needless to say, the (schematically depicted) controller 50 may be (partially) inside or outside the enclosure 2, and may have a unitary or composite structure, as desired. The skilled artisan will understand that the interior of the enclosure 2 does not have to be kept at a strict vacuum; for example, in a so-called "Environmental STEM", a background atmosphere of a given gas is deliberately introduced/maintained within the enclosure 2.

When an image of a specimen S is accumulated using a scanning-type microscope such as the subject 1 of FIG. 1, such accumulation occurs on a "pixel-by-pixel" basis, achieved by scanning the employed imaging beam relative to the specimen S. With reference to the concept of a "scan grid" G introduced and explained above (see FIG. 2A), such scanning conventionally causes the imaging beam to sequentially observe (and gather imaging data from) every cell C in the scan grid G—i.e. the beam performs 100% "observation" of the scan grid G. However, in the current invention, a radically different approach is employed, as will now be elucidated in more detail with reference to FIGS. 2 and 3.

Embodiment 2

FIGS. 2A and 2B schematically depict certain aspects of a conventional method of image accumulation in a scanning-type microscope (e.g. of a type as depicted in FIG. 1, or of an alternative type). In this context, FIG. 2A depicts a scan grid G of a type as alluded to above, which is an imaginary mathematical grid/matrix superimposed upon the (XY plane of the) specimen S and containing an array of juxtaposed sampling cells (pixels, sampling points) C; as here depicted, the grid G is orthogonal in nature, though this is not limiting, and other grid geometries (such as polar) could also be conceived. In conventional scanning microscopy, this entire scan grid G is "filled" because, in tracing out a scan path on the specimen S, the scanning beam sequentially observes (i.e. gathers data from) every cell C in the grid G. If grey shading is used to depict a cell C that is observed (measured) in this manner, then this prior-art situation is represented in FIG. 2B by the fact that the whole grid G is shaded grey. Since there is a certain "dwelling time" associated with the collection of data from each cell C (e.g. determined by the operating mechanism of detector(s) D and/or 22 in FIG. 1), such a scenario will obviously entail quite a large cumulative (i.e. summed) dwelling time to observe the whole grid G. This cumulative dwelling time will here be denoted by $T_G$.

Turning now to FIGS. 3A and 3B, these correspond (in broad terms) to FIG. 2B, except in that they depict certain aspects of an embodiment of an alternative, inventive method of image accumulation in a scanning-type microscope. In accordance herewith:

(i) Data accumulation (from the specimen S) is now broken down into a number of distinct sampling sessions $S_1, S_2, \ldots, S_i, \ldots$, performed in succession. Together, these form a set $\{S_n\}$ of sampling sessions.

(ii) In each such sampling session $S_i$, instead of visiting all of the cells C in grid G, only a relatively sparse collection $P_i$, of cells C is visited, representing a relatively thinly-populated subset of all the cells C in G. This situation is schematically illustrated in FIG. 3A for a sampling session $S_1$, whereby the depicted sprinkling/scattering of gray-shaded cells C represents a first (non-regular) collection $P_1$, of data cells (pixels, sampling points) that are observed during measurement session $S_1$. Because $P_1$, is relatively sparse, the cumulative (summed) dwelling time $T_{S1}$, associated with sampling session $S_1$ will be relatively short. For example, $P_1$, might have a sparsity (filling factor compared to the entire grid G) of the order of about 2%, whence $T_{S1} \sim 0.02 \times T_G$; this value is not limiting, and greater or smaller sparsities are fully consistent with the current invention (see, in this context, the end of item (v) below).

(iii) FIG. 3B depicts the filling geometry of the grid G for a second (non-regular) collection $P_2$ of data cells (pixels, sampling points) that are observed during a second measurement session $S_2$; just as there is a set $\{S_n\}$ of sampling sessions, there is an associated set $\{P_n\}$ of sampling point collections, whereby a collection $P_i$, is gathered during a corresponding session $S_i$. As in FIG. 3A/item (ii) above, sparse collection $P_2$ represents a relatively thinly-populated (grey-shaded) subset of all the cells C in G. Once again, because $P_2$ is relatively sparse, the cumulative (summed) dwelling time $T_{S2}$ associated with sampling session $S_2$ will be relatively short; for example, just as in item (ii) above, $P_2$ might have a sparsity (filling factor compared to the entire grid G) of the order of about 2%, whence $T_{S2} \sim 0.02 \times T_G$ (once again, this value is given purely as an example). In general, it should be noted that, for any given pair of members $P_i, P_j$, in $\{P_n\}$:

It can typically be assumed that $P_i \neq P_j$: in other words, the members of $\{P_n\}$ are generally mutually disparate (though, in principle, they may have some points/cells/pixels in common). Such mutual disparity can be usefully exploited in the integrative mathematical reconstruction procedure that is used by the current invention to assemble an image from $\{P_n\}$, in that, as set forth above, it leads to greater cumulative "coverage" of the specimen by sampling points (with, as a consequence, a greater "confidence level" in the final reconstructed image).

$P_i, P_j$ do not have to have the same number of data cells (sampling points), i.e. they may have different sparsities.

(iv) According to the invention, the cardinality N (size) of the set $\{S_n\}$ is a matter of choice, and can be selected in accordance with various factors, such as desired cumulative measurement time and/or imaging sharpness, specimen fragility, etc. In various experiments, the inventors used a whole scala of different values of N—varying from as little as 2 to as many as 256 (which values are quoted here for purposes of example only, and are not intended to be limiting vis-à-vis the scope of the appended claims). Depending (inter alia) on the chosen value of N, the cumulative dwelling time $T_c = \Sigma T_{Sn}$ (for all N sampling sessions combined) may or may not exceed $T_G$. For instance:

In certain cases, $T_c$ will be less than $T_G$, thus entailing an immediately evident throughput advantage relative to the prior-art.

In other cases, although $T_c$ might not be less than $T_G$, there will nevertheless be a throughput advantage. This is because, in contemporary scanning microscopy, use if often made of averaging techniques whereby several (e.g. a plurality $n_G$) full-grid images are obtained and then averaged, so as to mitigate noise effects. In such a scenario, the time required to assemble an averaged image will be $n_G \times T_G$; consequently, if $T_c < n_G \times T_G$, the invention will offer a throughput advantage relative to such averaging approaches.

Even if there is no such throughput advantage, subdividing the imaging procedure into N component sampling sessions in accordance with the invention generally allows sharper imaging results to be obtained than in the prior art (inter alia because of the inter-frame registration correction referred to above and in (vi) below).

(v) Using $\{P_n\}$ as a basis, an image can be assembled according to the invention using the aforementioned integrative reconstruction procedure. As part of this procedure, the various members of $\{P_n\}$ will (ultimately) be combined/integrated/hybridized into a composite data set $P_c$. Depending (inter alia) on choices previously made in steps (i)-(iv), this composite data set $P_c$ may, in principle, have any of a range of possible sparsity values (filling factors compared to 100% "coverage" of the cells C in grid G). In many instances, $P_c$ will be relatively sparse (e.g. of the order of about 20%), but, despite such sparsity, the invention nevertheless allows a satisfactory image to be mathematically reconstructed. With due regard to points (i)-(iv) above, one can, for example, choose a desired target value for the sparsity of $P_c$ (e.g. 25%), and then correspondingly pick the cardinality N and sparsity of each component collection $P_n$ so as to arrive at this target value (making allowance for possible overlap/redundancy of sampling points within $\{P_n\}$).

(vi) As set forth above, the operation in step (v) will have an associated registration correction, which may be performed before, during or after said integrative reconstruction procedure. In this regard, one may, for example, adopt a Type I or Type II approach as discussed above.

More details of the mathematical reconstruction procedure employed by the current invention will be given in the Embodiments that now follow.

Embodiment 3

As already set forth above, the current invention performs a mathematical registration correction to compensate for drift mismatches between different members of the set $\{P_n\}$. The general principles of such a registration correction can be elucidated in more detail as follows, whereby the term "set" will be used to refer to a collection D of data points/pixels acquired for imaging purposes. In particular:

When used in the context of a Type I approach (see item (I) above, and item (A) below), the term refers to a reconstructed sub-image $I_n$.

When used in the context of a Type II approach (see item (II) above, and item (B) below), the term refers to a "raw" collection $P_n$ of sampling points.

One can now distinguish between the following two situations.

(A)
When registering a first set $D_1$ with a second set $D_2$, a typical alignment algorithm performs the following tasks:
- Regard $D_2$ as being the result of applying a transformation T to $D_1$, and start with an initial estimate of this transformation T.
- Formulate a cost function $J(T(D_1), D_2)$, e.g. as a sum of squared differences, correlation, etc.
- Solve a local minimization problem $$\min_T J(T(D_1), D_2).$$

These steps are repeated until convergence occurs, which can, for example, be detected when J no longer decreases substantially. At each step, a pixel-to-pixel comparison is used in the evaluation of the cost function, and J can be typically expressed as:

$$J(T(D_1), D_2) = \int \delta(T(D_1)(x,y), D_2(x,y)) dx\, dy \qquad (1a)$$

where $\delta(.,.)$ is a local set similarity measure (e.g. an $l^P$ norm ($\|\cdot\|_p$), a correlation, an inter-pixel mutual information measure, etc.). Because one typically assumes a continuous function for the transformation T (e.g. rotation, scaling, shear, etc.), when $T(D_1)(x,y)$ is evaluated, interpolation can be used to compute an estimate from an original discrete image grid (full regular scan grid G).

(B)
Using the elucidation set forth in (A) above, one can extend the described registration approach to sparse image datasets by comparing a transformed image data point to the nearest one $(x_*, y_*)$ in the target image. This results in the following reformulation of expression (1a):

$$J(T(D_1), D_2) = \int \delta(T(D_1)(x,y), D_2(x_*, y_*)) dx\, dy \qquad (1b)$$

where $$(x_*, y_*) = \operatorname{argmin}_{u,v} \left\| \begin{pmatrix} u \\ v \end{pmatrix} - \begin{pmatrix} x \\ y \end{pmatrix} \right\|,$$

$(u,v) \in$ set of coordinates of $D_2$ data points.

If desired, one can limit candidate nearest points to those lying within a certain radius, using an appropriate distance threshold.

It should be noted that such an approach may encompass a point sets registration technique such as the Iterative Closest Point (ICP) algorithm; see, in this context, the following Wikipedia link, for example:
en.wikipedia.org/wiki/Iterative_closest_point Embodiment 4
Some general information on the mathematics of Compressive Sensing (Scanning/Sampling) can, for example, be gleaned from the following references:
dsp.rice.edu/cs
- Emmanuel Candès, Compressive Sampling, Int. Congress of Mathematics 3, pp. 1433-1452, Madrid, Spain, 2006:
  www-stat.stanford.edu/~candes/papers/Compressive-Sampling.pdf
- Richard Baraniuk, Compressive Sensing, IEEE Signal Processing Magazine 24(4), pp. 118-121, Jul. 2007:
  dsp.rice.edu/sites/dsp.rice.edu/files/cs/baraniukCSlecture07.pdf
- Justin Romberg, Imaging via Compressive Sampling, IEEE Signal Processing Magazine 25(2), pp. 14-20, Mar. 2008:
  dsp.rice.edu/sites/dsp.rice.edu/files/cs/Imaging-via-CS.pdf Essentially, the goal of Compressive Scanning algorithms is the reconstruction of an "original" signal from compressed measurements thereof. The following elucidation will outline a general approach to such a reconstruction, from which (with the aid of the various references above) the skilled artisan will be able to implement the current invention.

If $x \in \mathbb{R}^n$ is $\boldsymbol{K}$-sparse, which is defined as $\|x\|_0 \leq K \ll n$, one can characterize a sparse acquisition/measurement process by a measurement matrix $\Phi \in \mathbb{R}^{m \times n} (m < n)$.

One can then express the attendant measurements as:

$$y = \Phi x \qquad (2)$$

Literature references show that one can recover the sparse signal x by solving an $l^0$-minimization problem:

$$\min_x \|x\|_0 \qquad (3)$$

such that $y = \Phi x$

It has been shown that, if any set of $2\boldsymbol{K}$ columns from $\Phi$ are linearly independent, then the $l^0$-minimization approach can perfectly recover the original vector x. Despite the fact that an $l^0$-minimization technique can provide an accurate recovery of x, it is known that, due to the non-convexity of the $l^0$ norm, such reconstruction requires an exhaustive search over all possible combinations, so as to find the sparsest solution. To find a less computationally expensive approach to $l^0$-minimization, there have been many efforts to develop alternative algorithms. One alternative is to replace an $l^0$-minimization problem by an $l^1$-minimization problem:

$$\min_x \|x\|_1 \qquad (4)$$

such that $y = \Phi x$

If the $l^1$-norm is assumed to be convex, then solving (4) is computationally feasible. Also, it is known from convex optimization that solving (4) is equivalent to solving the Linear Programming (LP) problem:

$$\min_t l^T t, \qquad (5)$$

subject to $-t \leq x \leq t$ and $y = \Phi x$ where the vector inequality $x \leq t$ means that $x_i \leq t_i$ for all i. An advantage of $l^1$-minimization is the existence of proven numerical solvers. Additionally, this form of minimization has been shown to provide relatively simple conditions guaranteeing the accurate recovery of $\boldsymbol{K}$-sparse signals. These conditions can be formalized as the so-called Restricted Isometry Property (RIP) and the additional Incoherence Property (see mentioned references).

It is worth mentioning that several possible variations on the previously mentioned algorithms take into account various noise models (deterministic noise, stochastic noise, etc.).

Furthermore regularization techniques and Bayesian formulations can be used to stabilize convergence and embed prior knowledge.

Despite its advantages, the complexity associated with the LP approach is cubic in the size of the original vector to be recovered ($O(n^3)$), so that this approach tends to be impractical for large systems. An alternative, more computationally-tractable approach to finding the sparest solution of (2) is based on so-called "greedy algorithms". Such algorithms iteratively find an approximation of the original signal and an associated "support" (defined as the index set of nonzero elements), either by sequentially identifying the support of the signal, or by refining the estimate of the signal gradually.

Representative algorithms of this category include Orthogonal Matching Pursuit (OMP), Iterative Hard Thresholding (I HT), Subspace Pursuit (SP), and Compressive Sampling Matching Pursuit (CoSaMP) algorithms (which are set forth in more detail in the provided references).

In particular, one well-known representative of the greedy approach family—OMP—is attractive for its good performance and low computational complexity. The OMP algorithm iteratively estimates the signal x and its support. If the $K$-sparse vector x is supported on T and if we define variables $T_k$, $X_k$ and $r_k$ as, respectively, the estimated support, the estimated sparse signal, and the residual ($r_k = y - \Phi x_k$) in the k-th iteration, then the OMP algorithm repeats the following steps until $r_k$ reaches zero or until a user-defined number of iterations has been reached (assuming initial values k=0, $r_0$=y, $T_0$=Ø):

Find the largest element in magnitude and the corresponding index $t_k$ among correlations between $\phi_i$(i-th column of $\Phi$) and the residual $r_{k-1}$ generated in the (k−1)-th iteration:

$$t_k = \mathrm{argmax}_i |\langle r_{k-1}, \phi_i \rangle| \quad (6)$$

Add index $t_k$ into the estimated support set:

$$T_k = T_{k-1} \cup \{t_k\} \quad (7)$$

Solve the least squares (LS) problem:

$$x_k = \mathrm{argmin}_{supp(u) = T_k} \|y - \Phi u\|_2 \quad (8)$$

Update the residual of the k-th iteration as $$r_k = y - \Phi x_k \quad (9)$$

Embodiment 5

Some further mathematical considerations pertaining to the sparse image registration correction of the current invention will now be elucidated.

Defining a Differentiable and Asymptotically Convex Point-Sets Registration Criterion As an alternative to the ICP algorithm described earlier, one can use a technique called Gaussian Fields Registration (GFR) to align the sparse image data points (see, for example, references [1], [2] below). This approach defines the registered position as one resulting in the maximum point-to-point overlap (or maximum proximity, in a relaxed form) between reference and transformed datasets.

To derive the GFR criterion, one starts with a basic combinatorial Boolean criterion satisfying the maximum (point-to-point) overlap of two sparse image point-sets:

$$M = \{P_i\}_{i=1\ldots N_M} \text{ and } D = \{Q_j\}_{j=1\ldots N_D},$$

which are registered using a transformation Tr*. Let us first assume a noiseless case (noise will be addressed later), and also assume that M and D have a maximum point-to-point overlap at the registered position. The ICP algorithm (previously alluded to) was based on this same assumption. Given these definitions, the following criterion (10) will have a global maximum at Tr*:

$$E(Tr) = \sum_{\substack{i=1\ldots N_M \\ j=1\ldots N_D}} \delta(d(Tr(P_i), Q_j)) \text{ with} \quad (10)$$

$$\delta(t) = \begin{cases} 1 & \text{for } t = 0 \\ 0 & \text{otherwise} \end{cases},$$

where d(P,Q) is a distance measure (e.g. Euclidean) between points. In addition to the sparse point locations, adding a quantity such as the associated image intensity to this criterion is straightforward, and requires just using a higher-dimensional representation of the datasets, where points are defined by both position and a vector of intensity/color attributes:

$$M = \{(P_i, S(P_i))\}_{i=1\ldots N_M} \text{ and } D = \{(Q_j, S(Q_j))\}_{j=1\ldots N_D}.$$

Given that the combinatorial criterion in (10) is not continuous with respect to the alignment transformations, it will be difficult to find the global maximum. To overcome this problem, one can use a smooth approximation of E(Tr) obtained using an analytical method known as "Mollification" (see, for example, reference [3] below, in which a similar approach is employed to regularize ill-posed problems with non-differentiable cost functions).

An arbitrary non-differentiable function f(t) defined on $\Omega \subset \Re^d$ can be "mollified" by convolution with the Gaussian kernel $$\rho_\sigma(t) = \exp\left(\frac{-t^2}{\sigma^2}\right)$$

as follows:

$$f_\sigma(t) = (\rho_\sigma * f)(t) = \int_\Omega \exp\left(\frac{-(t-s)^2}{\sigma^2}\right) f(s) ds. \quad (11)$$

The resulting function $f\sigma(t)$ will satisfy $$\lim_{\sigma \to 0} f_\sigma(t) = f(t) \text{ and } f_\sigma \in C^\infty(\Omega).$$

The transformation described in (11) is also known as the Gauss Transform. If one applies mollification to the criterion E(Tr) [see (10)], one obtains:

$$E_\sigma(Tr) = \int \exp\left(-\frac{(d(Tr(P_i), Q_j) - s)^2}{\sigma^2}\right) \left\{\sum_{\substack{i=1\ldots N_M \\ j=1\ldots N_D}} \delta(d(Tr(P_i), Q_j))\right\} ds$$

One can now define:

$$d_{ij} = d(Tr(P_i), Q_j)$$

and $$E_\sigma(Tr) = \int \exp\left(-\frac{(d_{ij}-s)^2}{\sigma^2}\right)\left\{\sum_{\substack{i=1\ldots N_M \\ j=1\ldots N_D}} \delta(d_{ij})\right\}ds$$

$$= \sum_{\substack{i=1\ldots N_M \\ j=1\ldots N_D}} \int \exp\left(-\frac{(d_{ij}-s)^2}{\sigma^2}\right)\delta(d_{ij})ds$$

$$= \sum_{\substack{i=1\ldots N_M \\ j=1\ldots N_D}} \int \exp\left(-\frac{s^2}{\sigma^2}\right)\delta(d_{ij}-s)ds.$$

Knowing that $\delta(d_{ij}-s)$ is non-zero only for $s=d_{ij}$, the last integral will be simplified to:

$$\int \exp\left(-\frac{s^2}{\sigma^2}\right)\delta(d_{ij}-s)ds = \exp\left(-\frac{d_{ij}^2}{\sigma^2}\right)$$

which leads to:

$$E_\sigma(Tr) = \sum_{\substack{i=1\ldots N_M \\ j=1\ldots N_D}} \exp\left(-\frac{d_{ij}^2}{\sigma^2}\right) = \sum_{\substack{i=1\ldots N_M \\ j=1\ldots N_D}} \exp\left(-\frac{d^2(Tr(P_i), Q_j)}{\sigma^2}\right) \quad (12)$$

The mollified criterion $E\sigma(Tr)$ is a sum of Gaussians of distances between all pairs of reference and transformed data points. Deriving an analogy from physics, expression (12) can be viewed as the integration of a potential field generated by sources located at points in one of the datasets acting on targets in the other one. The effects of noise, affecting the spatial localization of the point sets, are addressed by relaxing the parameter $\sigma$ to values near that of noise variance.

The Gaussian registration criterion can now be extended to include measurement information (e.g. Backscatter intensity, emitted photons intensity . . . ) which is used in addition to the spatial location of the sparse points. This is done by extending the distance measure between points in the criterion as follows:

$$E_{\sigma,\Sigma}(Tr) = \sum_{\substack{i=1\ldots N_M \\ j=1\ldots N_D}} \exp\left(-\frac{\|Tr(P_i)-Q_j\|^2}{\sigma^2} - (S(Tr(P_i))-S(Q_j))^T\Sigma^{-1}(S(Tr(P_i))-S(Q_j))\right) \quad (13)$$

where $\|\ldots\|$ is the Euclidean distance, and the matrix $\Sigma$, which is associated with the measurements vector $S(.)$ is a diagonal matrix with positive elements, which extends the mollification to higher dimensions. Defining:

$$\omega_\Sigma^{ij}(Tr) = \exp(-(S(Tr(P_i))-S(Q_j))^T\Sigma^{-1}(S(Tr(P_i))-S(Q_j)))$$

the registration criterion becomes:

$$E_{\sigma,\Sigma}(Tr) = \sum_{\substack{i=1\ldots N_M \\ j=1\ldots N_D}} \omega_\Sigma^{ij}(Tr)\exp\left(-\frac{\|Tr(P_i)-Q_j\|^2}{\sigma^2}\right) \quad (14)$$

Given that the measurement vector is independent of the aligning transformations, the coefficients $\omega_\Sigma^{ij}$ will not depend on Tr.

Optimizing the Criterion

For various registration transformations, including rigid and affine models, the criterion $E_{\sigma,\Sigma}(Tr)$ can be shown to be continuously differentiable. Furthermore, $E_{\sigma,\Sigma}(Tr)$ will generally have a bell-shape in parameter space in the case of a mixture of closely packed Gaussians. Given this and the nature of the current datasets, one can assume a smooth convex behavior around the registered position. This allows for the use of a variety of powerful convex optimization techniques, such as the quasi-Newton algorithm: see, for example:

en.wikipedia.org/wiki/Quasi-Newton_method

The gradient of $E_{o,\Sigma}(Tr)$ with respect to a given registration parameter $\alpha$ is expressed as:

$$\frac{\partial E_{\sigma,\Sigma}(Tr)}{\partial \alpha} = \sum_{\substack{i=1\ldots N_M \\ j=1\ldots N_D}} \frac{-2\omega_\Sigma^{ij}}{\sigma^2}\frac{\partial Tr(P_i)}{\partial \alpha}\cdot(Tr(P_i)-Q_j)\exp\left(-\frac{\|Tr(P_i)-Q_j\|^2}{\sigma^2}\right) \quad (15)$$

The gradient expression and an approximation of the Hessian are used in the quasi-Newton scheme to update descent directions minimizing $-E_{o,\Sigma}(Tr)$. In each descent direction, a line search routine is used to find the optimum. The procedure is iterated until convergence.

Fast computation of the registration criterion

Evaluating $E_{o,\Sigma}(Tr)$ at each iteration of the registration algorithm will have a relatively high computational cost of $O(N_M \times N_D)$. A technique called the Fast Gauss Transform (FGT) (see, for example, references [4], [5] below) can be employed to speed up the process, leading to a computational complexity of only $O(N_M + N_D)$. The FGT method uses the fact that calculations are only needed up to a given accuracy. For computing sums of the form:

$$S(t_i) = \sum_{j=1}^N f_j \exp\left(-\left(\frac{s_j-t_i}{\sigma}\right)^2\right), i=1,\ldots,M,$$

where T,? are the centers of the Gaussians known as "sources" and T,? are defined as "targets", the following reformulation and expansion in Hermite series is employed:

$$\exp\left(\frac{-(t-s)^2}{\sigma^2}\right) = \exp\left(\frac{-(t-s_0-(s-s_0))^2}{\sigma^2}\right) = \exp\left(\frac{-(t-s_0)^2}{\sigma^2}\right)\sum_{n=0}^\infty \frac{1}{n!}\left(\frac{s-s_0}{\sigma}\right)^n H_n\left(\frac{t-s_0}{\sigma}\right) \quad (16)$$

where $H_n$ are the Hermite polynomials. These series converge rapidly and only few terms are needed for a given precision; therefore the new expression can be used to cluster several sources into one virtual source $s_0$ with a linear cost for a given precision.

The clustered sources can then be evaluated at the targets. In a case where the number of targets is also relatively large, Taylor series (17) can now be used to cluster targets together into a virtual center $t_0$, further reducing the number of computations $$\exp\left(-\left(\frac{t-s}{\sigma}\right)^2\right) = \exp\left(\frac{-(t-t_0-(s-t_0))^2}{\sigma^2}\right) \approx \sum_{n=0}^{p} \frac{1}{n!} h_n\left(\frac{s-t_0}{\sigma}\right)\left(\frac{t-t_0}{\sigma}\right)^n \quad (17)$$

In (17), the Hermite functions $h_n(t)$ are defined by $h_n(t) = e^{-t^2} H_n(t)$. This can be shown to converge asymptotically to a linear computational complexity as the number of sources and targets increases. For further gains in speed, a variant of the FGT method, called the Improved Fast Gauss Transform (IFGT), can be employed (see, for example, reference [6] below), where a data-clustering scheme along with a multivariate Taylor expansion allows for further computational gains in datasets with high dimensions. In the current convex optimization scheme, computing the gradient of the Gaussian criterion is reduced to the computation of a weighted sum version similar to the criterion itself.

Therefore the gradient can also be evaluated efficiently using FGT techniques.

Some background information relating to certain of the mathematical concepts referred to above can, for example, be gleaned from the following literature sources: [1] F. Boughorbel, A. Koschan, B. Abidi, and M. Abidi, "Gaussian Fields: a New Criterion for 3D Rigid Registration," Pattern Recognition 37 (7), pp. 1567-1571 (Jul. 2004). [2] F. Boughorbel, M. Mercimek, A. Koschan, and M. Abidi, "A new method for the registration of three-dimensional point-sets: The Gaussian Fields Framework," *Image and Vision Computing* 28, pp. 124-137 (2010). [3] D. A. Murio, "The Mollification Method and the Numerical Solution of Ill-Posed Problems", Wiley, N.Y. (1993). [4] A. Elgammal, R. Duraiswami, L. Davis, "Efficient kernel density estimation using the Fast Gauss Transform with applications to color modeling and tracking", IEEE Trans. Pattern Analysis and Machine Intelligence 25 (11), pp. 1499-1504 (2003). [5] Greengard, J. Strain, "The fast Gauss Transform", SIAM J. Scientific Computing 12 (1), pp. 79-94 (1991). [6] C. Yang, R. Duraiswami, N. A. Gumerov, L. Davis, "Improved fast gauss transform and efficient kernel density estimation", Proc. Ninth Int. Conf. Computer Vision, IEEE, Nice, France, pp. 464-471 (2003).

The invention claimed is:

1. A method of accumulating an image of a specimen using a scanning-type microscope, comprising the following steps:
   providing a beam of radiation that is directed from a source through an illuminator so as to irradiate the specimen;
   providing a detector for detecting a flux of radiation emanating from the specimen in response to said irradiation;
   causing said beam to undergo scanning motion relative to a surface of the specimen, and recording an output of the detector as a function of scan position,
   in a first sampling session $S_1$, gathering detector data from a first collection $P_1$ of sampling points distributed sparsely across the specimen, the collection $P_1$ comprising fewer than all the sampling points in a sampling grid;
   repeating this the procedure of gathering detector data from subsequent collections of sampling points so as to accumulate a set $\{P_n\}$ of such collections, gathered during an associated set $\{S_n\}$ of sampling sessions, each set with a cardinality N>1;
   assembling an image of the specimen by using the set $\{P_n\}$ as input to an integrative mathematical reconstruction procedure,
   wherein, as part of said assembly process, a mathematical registration correction is made to compensate for drift mismatches between different members of the set $\{P_n\}$.

2. A method according to claim 1, wherein:
   each member $P_n$ of the set $\{P_n\}$ is used to mathematically reconstruct a corresponding sub-image $I_n$;
   said mathematical registration correction is used to align the members of the sub-image set $\{I_n\}$;
   a combined image is mathematically composed from said aligned sub-image set.

3. A method according to claim 1, wherein:
   prior to reconstruction, said mathematical registration correction is used to align the members of the collection set $\{P_n\}$;
   a composite image is mathematically reconstructed from said aligned collection set.

4. A method according to claim 1, wherein different members of the set $\{P_n\}$ have different associated sparse distributions of sampling points across the specimen.

5. A method according claim 1, wherein at least one member $P_n$ of the set $\{P_n\}$ comprises a sparse distribution of sampling points that is not arranged on a regular grid.

6. A method according to claim 1, wherein correction is made for lower-order drift mismatches selected from the group consisting of displacement, rotation, and combinations hereof.

7. A method according to claim 1, wherein correction is made for higher-order drift mismatches selected from the group consisting of skew, shear, scaling, and combinations hereof.

8. A method according to claim 1, wherein the positions of sampling points in at least one given collection $P_n$ are at least partially elected on the basis of an analysis of at least some scan information obtained from at least one previous sampling sessions $S_n$.

9. A method according to claim 8, wherein;
   in a given sampling session $S_n$, sampling points in the associated collection $P_n$ are visited sequentially while scanning out a line-by-line pattern on the specimen;
   along a given line $L_j$ in said line-by-line pattern, the positions of sampling points are elected using detection results obtained in scanning a previous line $L_i$ in said line-by-line pattern.

10. A method according to claim 1, wherein, in at least one sampling session $S_n$, at least some of the sampling points in the associated collection $P_n$ are located below said surface of the specimen.

11. A method according to claim 1, wherein the set $\{P_n\}$ is accumulated using a plurality of beams of radiation.

12. A method according to claim 1, wherein said radiation comprises charged particles and said microscope comprises a charged-particle microscope.

13. A method according to claim 12, wherein said charged-particle microscope is selected from the group consisting of a Scanning Electron Microscope and a Scanning Transmission Electron Microscope.

14. A method according to claim 1, wherein said radiation comprises photons and said microscope comprises a confocal microscope.

15. A scanning-type microscope, comprising:
a specimen holder, for holding a specimen;
a source, for producing a beam of radiation;
an illuminator, for directing said beam so as to irradiate said specimen;
a detector, for detecting a flux of radiation emanating from the specimen in response to said irradiation;
beam deflectors, for causing said beam to undergo scanning motion relative to a surface of the specimen;
a controller, for recording an output of said detector as a function of scan position, wherein the controller stores instructions which can be invoked to execute the following steps:
in a first sampling session $S_1$, gathering detector data from a first collection $P_1$ of sampling points distributed sparsely across the specimen, the collection $P_1$ comprising fewer than all the sampling points in a sampling grid;
repeating the procedure of gathering detector data from subsequent collections of sampling points so as to accumulate a set $\{P_n\}$ of such collections, gathered during an associated set $\{S_n\}$ of sampling sessions, each set with a cardinality $N>1$;
assembling an image of the specimen by using the set $\{P_n\}$ as input to an integrative mathematical reconstruction procedure; and
as part of said assembly process, making a mathematical registration correction to compensate for drift mismatches between different members of the set $\{P_n\}$.

16. The scanning-type microscope of claim 15 wherein the stored instructions include instructions for correction of lower-order drift mismatches selected from the group consisting of displacement, rotation, and combinations hereof.

17. The scanning-type microscope of claim 15 wherein the stored instructions include instructions for correction of higher-order drift mismatches selected from the group consisting of skew, shear, scaling, and combinations hereof.

18. The scanning-type microscope of claim 15, wherein said radiation comprises charged particles and said microscope comprises a charged-particle microscope.

19. The scanning-type microscope of claim 15, wherein said radiation comprises photons and said microscope comprises a confocal microscope.

20. The scanning-type microscope of claim 15 wherein the stored instructions include instructions for, in at least one sampling session $S_n$, at least some of the sampling points in the associated collection $P_n$ are located below said surface of the specimen.

* * * * *